US009897705B2

(12) United States Patent
Horiuchi et al.

(10) Patent No.: US 9,897,705 B2
(45) Date of Patent: Feb. 20, 2018

(54) RADIATION DETECTOR, SCINTILLATOR PANEL, AND METHOD FOR MANUFACTURING THE SAME

(71) Applicant: Toshiba Electron Tubes & Devices Co., Ltd., Otawara-shi (JP)

(72) Inventors: Hiroshi Horiuchi, Ootawara (JP); Hiroshi Aida, Ootawara (JP); Atsuya Yoshida, Ootawara (JP)

(73) Assignee: Toshiba Electron Tubes & Devices Co., Ltd., Otawara-shi (JP)

( * ) Notice: Subject to any disclaimer, the term of this patent is extended or adjusted under 35 U.S.C. 154(b) by 0 days.

(21) Appl. No.: 14/989,242

(22) Filed: Jan. 6, 2016

(65) Prior Publication Data
US 2016/0116607 A1 Apr. 28, 2016

Related U.S. Application Data

(63) Continuation of application No. PCT/JP2014/064036, filed on May 27, 2014.

(30) Foreign Application Priority Data

Jul. 16, 2013 (JP) .................................. 2013-147885
Jul. 16, 2013 (JP) .................................. 2013-147886
(Continued)

(51) Int. Cl.
*G01T 1/202* (2006.01)
*C09K 11/62* (2006.01)
(Continued)

(52) U.S. Cl.
CPC .......... *G01T 1/2023* (2013.01); *C09K 11/628* (2013.01); *C23C 14/34* (2013.01);
(Continued)

(58) Field of Classification Search
CPC ....... G01T 1/2023; G01T 1/2018; G01T 3/06; G30B 25/02; G30B 25/03; G30B 25/06; G30B 25/08
See application file for complete search history.

(56) References Cited

U.S. PATENT DOCUMENTS 3,888,685 A * 6/1975 Kaes .......................... C03C 3/16
252/301.4 F
4,437,011 A * 3/1984 Noji ...................... H01J 29/385
250/483.1
(Continued)

FOREIGN PATENT DOCUMENTS

CN 102725658 A 10/2012
CN 103060752 A 4/2013
(Continued)

OTHER PUBLICATIONS

International Search Report dated Aug. 5, 2014 in PCT/JP2014/064036 filed May 27, 2014 (with English translation).
(Continued)

*Primary Examiner* — David Porta
*Assistant Examiner* — Djura Malevic
(74) *Attorney, Agent, or Firm* — Oblon, McClelland, Maier & Neustadt, L.L.P.

(57) ABSTRACT

According to the embodiment, a radiation detector includes a photoelectric conversion substrate converting light to an electrical signal and a scintillator layer being in contact with the photoelectric conversion substrate and converting externally incident radiation to light. The scintillator layer is made of a phosphor containing Tl as an activator in CsI, which is a halide. A concentration of the activator in the phosphor is 1.6 mass %±0.4 mass %, and a concentration distribution of the activator in an in-plane direction and a film thickness direction is within ±15%.

9 Claims, 10 Drawing Sheets

C1: the concentration distribution of the activator in the scintillator layer in the in-plane direction
C2: the concentration distribution of the activator in the scintillator layer in the film thickness direction

(30) Foreign Application Priority Data

Dec. 5, 2013 (JP) ................................ 2013-252419
Dec. 5, 2013 (JP) ................................ 2013-252420

(51) Int. Cl.

| | |
|---|---|
| C23C 14/34 | (2006.01) |
| C30B 23/02 | (2006.01) |
| C30B 23/08 | (2006.01) |
| C30B 25/02 | (2006.01) |
| C30B 25/06 | (2006.01) |
| C30B 29/10 | (2006.01) |
| G01T 1/20 | (2006.01) |
| G21K 4/00 | (2006.01) |

(52) U.S. Cl.
CPC .............. *C30B 23/02* (2013.01); *C30B 23/08* (2013.01); *C30B 25/02* (2013.01); *C30B 25/06* (2013.01); *C30B 29/10* (2013.01); *G01T 1/202* (2013.01); *G01T 1/2018* (2013.01); *G21K 2004/12* (2013.01)

(56) References Cited

U.S. PATENT DOCUMENTS

| | | | |
|---|---|---|---|
| 4,806,757 A | 2/1989 | Kano et al. | |
| 7,180,068 B1* | 2/2007 | Brecher | C09K 11/772 250/361 R |
| 7,538,330 B2* | 5/2009 | Nomura | G01T 1/2018 250/367 |
| 7,759,645 B1* | 7/2010 | Brecher | G01T 1/202 250/361 R |
| 8,049,177 B2* | 11/2011 | Sato | G01T 1/2018 250/367 |
| 8,669,526 B2* | 3/2014 | Kasai | C09K 11/628 250/361 R |
| 8,779,365 B2* | 7/2014 | Williams | C09K 11/616 250/361 R |
| 8,962,370 B2* | 2/2015 | Kawanishi | H01L 31/115 250/362 |
| 9,121,952 B2* | 9/2015 | Williams | C09K 11/616 |
| 2003/0047697 A1* | 3/2003 | Iwabuchi | C09K 11/616 250/584 |
| 2007/0051896 A1* | 3/2007 | Okada | G01T 1/2018 250/370.11 |
| 2007/0205371 A1* | 9/2007 | Inoue | G01T 1/2018 250/370.11 |
| 2007/0267576 A1* | 11/2007 | Loureiro | G01T 1/202 250/362 |
| 2008/0083877 A1* | 4/2008 | Nomura | G01T 1/2018 250/370.11 |
| 2008/0099694 A1* | 5/2008 | Shoji | G01T 1/2018 250/483.1 |
| 2008/0217550 A1* | 9/2008 | Shoji | G01T 1/2018 250/370.11 |
| 2010/0001209 A1* | 1/2010 | Osinski | C09K 11/664 250/459.1 |
| 2010/0117006 A1* | 5/2010 | Sawamoto | C09K 11/628 250/484.4 |
| 2011/0036985 A1* | 2/2011 | Inoue | G01T 1/2018 250/366 |
| 2011/0204247 A1* | 8/2011 | Kasai | C09K 11/628 250/370.11 |
| 2012/0049075 A1* | 3/2012 | Nariyuki | G01T 1/1642 250/368 |
| 2012/0217407 A1* | 8/2012 | Iwakiri | G01T 1/2018 250/366 |
| 2012/0292516 A1 | 11/2012 | Yasui et al. | |
| 2013/0099126 A1* | 4/2013 | Iwata | G01T 1/2018 250/366 |
| 2014/0008550 A1* | 1/2014 | Williams | C09K 11/616 250/483.1 |

FOREIGN PATENT DOCUMENTS

| | | |
|---|---|---|
| JP | 2007-232636 | 9/2007 |
| JP | 2008-51793 | 3/2008 |
| JP | 2008-224357 | 9/2008 |
| JP | 2013-108974 | 6/2013 |
| WO | WO 2011/133545 A1 | 10/2011 |

OTHER PUBLICATIONS

Written Opinion dated Aug. 5, 2014 in PCT/JP2014/064036 filed May 27, 2014.
WIPO Communication for PCT/JP2014/064036, dated Nov. 26, 2014.
Extended European Search Report dated Dec. 13, 2016 in Patent Application No. 14825823.9.
Bo Kyung Cha, et al., "Scintillation characteristics and imaging performance of CsI:Tl thin films for X-ray imaging applications" Nuclear Instruments and Methods in Physics Research A, vol. 604, XP026211014, 2009, pp. 224-228.
Office Action dated Jan. 27, 2017 in Korean Patent Application No. 10-2016-7002699 (with English language translation).
Office Action dated Apr. 19, 2017 in Chinese Patent Application No. 201480040504.4.
Jia Shan Xun and He Xin Gu, "Cesium(thallium) iodide crystal of short persistence used for a safe detection equipment [Police Technique]", China Academic Journal Electronic Publishing House, 1998, pp. 20-23.

* cited by examiner

| Tl concentration in scintillator layer(mass%) | Sensitivity ratio | MTF ratio (at 2Lp/mm) | Residual image ratio |
|---|---|---|---|
| 0.1 | 1.00 | 1.00 | 1.00 |
| 1.0 | 1.23 | 1.00 | 0.50 |
| 1.2 | 1.25 | 1.00 | 0.30 |
| 1.8 | 1.30 | 1.00 | 0.14 |
| 2.0 | 1.24 | 1.00 | 0.19 |

FIG. 14

RADIATION DETECTOR, SCINTILLATOR PANEL, AND METHOD FOR MANUFACTURING THE SAME

CROSS-REFERENCE TO RELATED APPLICATIONS

This application is based upon and claims the benefit of priority from Japanese Patent Application No. 2013-147885, filed on Jul. 16, 2013, Japanese Patent Application No. 2013-147886, filed on Jul. 16, 2013, Japanese Patent Application No. 2013-252419, filed on Dec. 5, 2013, and Japanese Patent Application No. 2013-252420, filed on Dec. 5, 2013; the entire contents of which are incorporated herein by reference.

FIELD

Embodiments described herein relate generally to a radiation detector, a scintillator panel, and a method for manufacturing the same.

BACKGROUND

An X-ray detector can be realized as a flat radiation detector based on solid-state imaging elements such as active matrix, CCD, and CMOS. Such an X-ray detector is drawing attention as a new-generation X-ray image detector for diagnosis. A radiographic image or real-time X-ray image is outputted as digital signals by irradiating this X-ray detector with X-rays.

The X-ray detector includes a photoelectric conversion substrate for converting light to electrical signals, and a scintillator layer in contact with the photoelectric conversion substrate. The scintillator layer converts externally incident X-rays to light. The light converted from incident X-rays in the scintillator layer reaches the photoelectric conversion substrate and is converted to electric charge. This charge is read as an output signal and converted to digital image signals in e.g. a prescribed signal processing circuit.

The scintillator layer may be made of CsI, which is a halide. In this case, incident X-rays cannot be converted to visible light by CsI alone. Thus, as in commonly-used phosphors, an activator is contained to activate excitation of light in response to incident X-rays.

In the X-ray detector, the light reception sensitivity of the photoelectric conversion substrate has a peak wavelength around 400-700 nm in the visible range. Thus, in the case where the scintillator layer is made of CsI, Tl is used as an activator. Then, the light excited by incident X-rays has a wavelength around 550 nm.

The scintillator layer may be made of a phosphor containing Tl as an activator in CsI, which is a halide. In this case, as in commonly-used phosphors containing an activator, the characteristics of the scintillator layer are significantly affected by the concentration and concentration distribution of Tl serving as an activator.

In the X-ray detector including a scintillator layer containing an activator, lack of optimization of the concentration and concentration distribution of the activator incurs characteristics degradation of the scintillator layer. This affects the sensitivity (light emission efficiency) and residual image (the phenomenon in which the subject image of the X-ray image at the (n−1)-th or earlier time remains in the X-ray image at the n-th time) related to the light emission characteristics of the scintillator layer.

For instance, in diagnosis using X-ray images, the radiography condition significantly varies with subjects (incident X-rays at a dose of approximately 0.0087-0.87 mGy, because the X-ray transmittance varies with body regions). This may cause a significant difference in the dose of incident X-rays between the (n−1)-th X-ray image and the n-th X-ray image. Here, if the dose of incident X-rays in the (n−1)-th X-ray image is greater than that in the n-th X-ray image, the light emission characteristics of the scintillator layer in the non-subject part of the (n−1)-th X-ray image is changed by the great energy of incident X-rays. This influence remains also in the n-th X-ray image and produces a residual image.

In diagnosis using X-ray images, the residual image characteristic is more important than other characteristics of the scintillator layer such as sensitivity (light emission efficiency) and resolution (MTF).

Conventionally, there have been proposals for defining the concentration and concentration distribution of the activator of the scintillator layer for the purpose of improving sensitivity (light emission efficiency) and resolution (MTF).

BRIEF DESCRIPTION OF THE DRAWINGS

FIG. 13A is an X-ray image at a Tl concentration of 0.1 mass %. FIG. 13B is an X-ray image at a Tl concentration of 1.0 mass %. FIG. 13C is an X-ray image at a Tl concentration of 1.2 mass %. FIG. 13D is an X-ray image at a Tl concentration of 1.6 mass %. FIG. 13E is an X-ray image at a Tl concentration of 2.0 mass %;

FIG. 14 is a table showing characteristics of the above radiation detector at a Tl concentration of 0.1 mass %, 1.0 mass %, 1.2 mass %, 1.6 mass %, and 2.0 mass %;

DETAILED DESCRIPTION

Conventional proposals for characteristics improvement of the scintillator layer largely relate to sensitivity (light emission efficiency) and resolution (MTF). There have been few proposals related to overall characteristics improvement including the residual image characteristic.

The problem to be solved by the invention is to provide a radiation detector, a scintillator panel, and a method for manufacturing the same capable of improving overall characteristics including the residual image characteristic of the scintillator layer.

According to the embodiment, a radiation detector includes a photoelectric conversion substrate converting light to an electrical signal and a scintillator layer being in contact with the photoelectric conversion substrate and converting externally incident radiation to light. The scintillator layer is made of a phosphor containing Tl as an activator in CsI, which is a halide. A concentration of the activator in the phosphor is 1.6 mass %±0.4 mass %, and a concentration distribution of the activator in an in-plane direction and a film thickness direction is within ±15%.

Various Embodiments will be described hereinafter with reference to FIG. 1 to FIG. 19.

Figure 3:
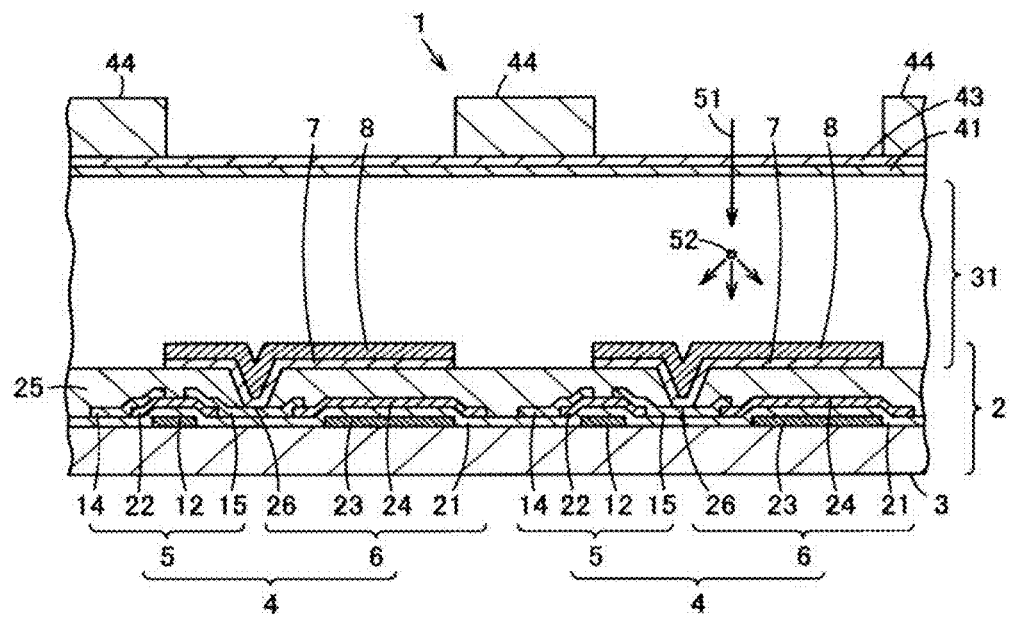
FIG. 3 is a sectional view of a third structure example of the above radiation detector.
Figure 4:
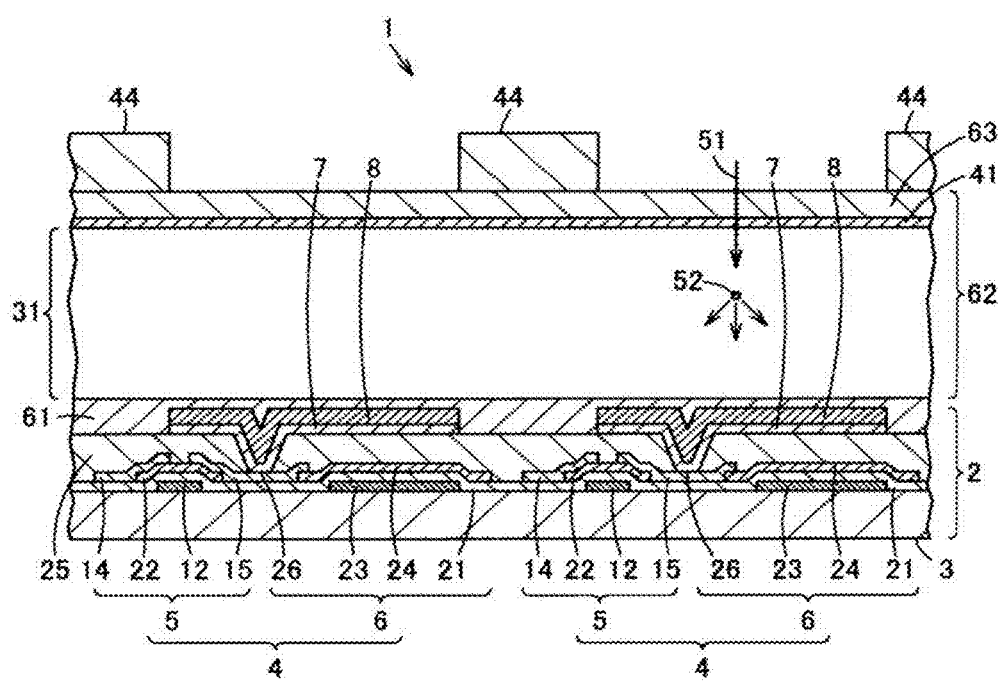
FIG. 4 is a sectional view of a fourth structure example of the above radiation detector.
Figure 5:
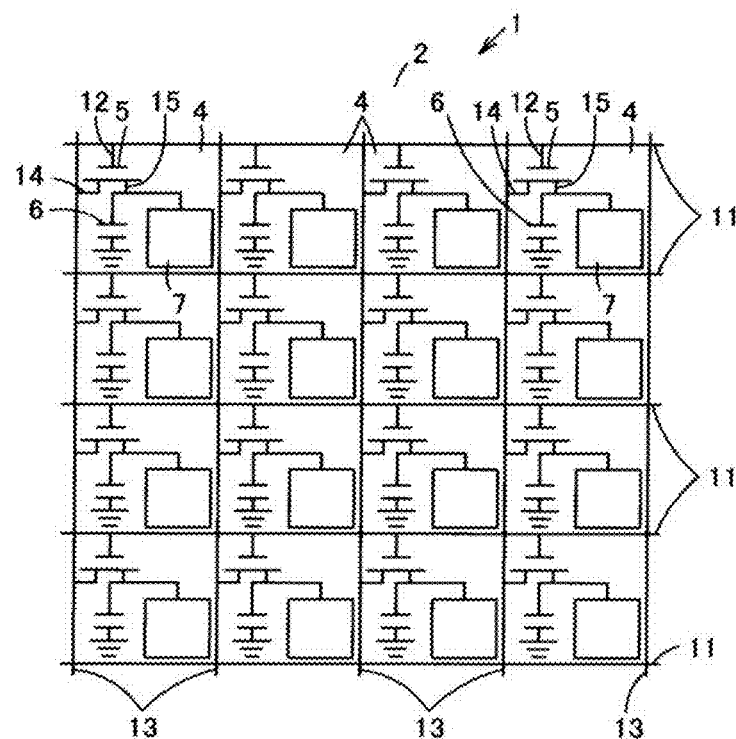
FIG. 5 is an equivalent circuit diagram of the above radiation detector.

In FIG. 1 to FIG. 4, the basic configuration of a radiation detector 1 is described with reference to first to fourth structure examples. FIG. 5 shows an equivalent circuit diagram of the basic configuration.

Figure 1:
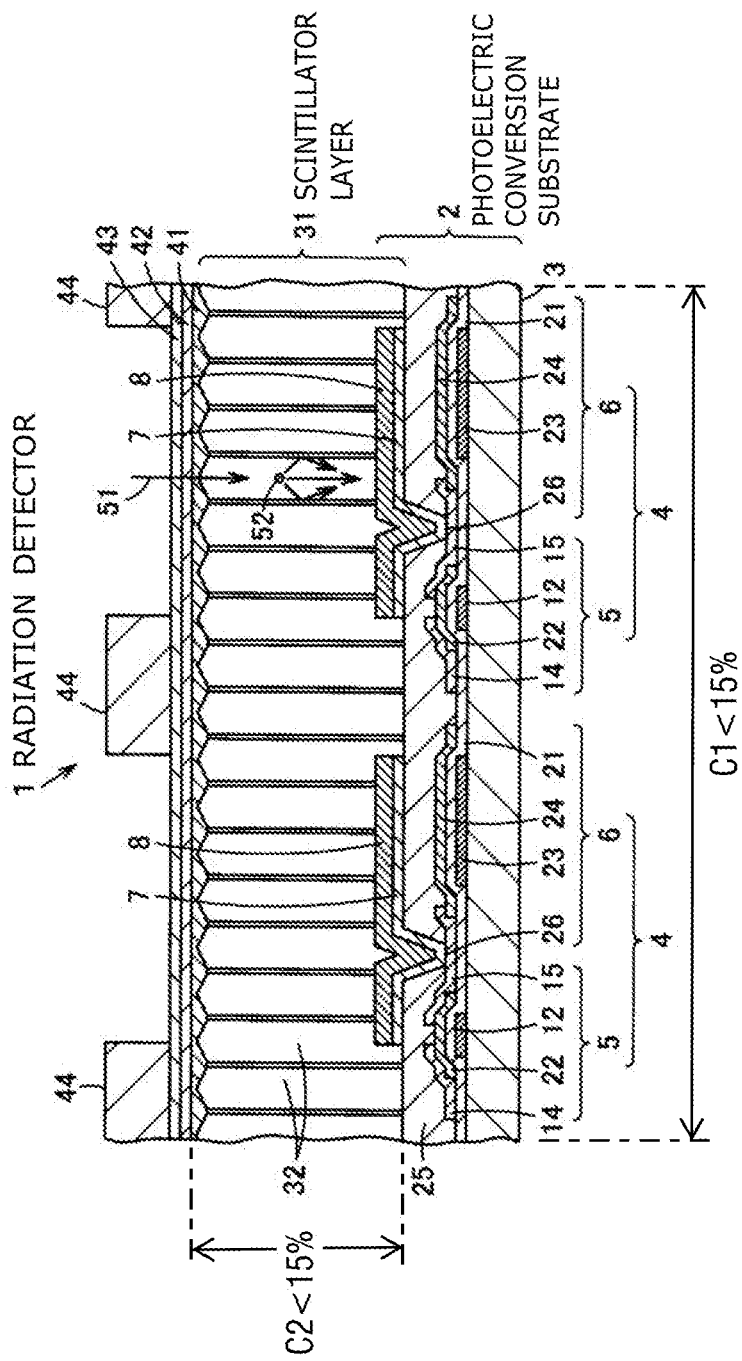
FIG. 1 is a sectional view of a first structure example of a radiation detector showing an embodiment.

First, a first structure example of the X-ray detector 1 as a radiation detector is described with reference to FIG. 1 and FIG. 5. As shown in FIG. 1, the X-ray detector 1 is an indirect-type flat X-ray image detector. The X-ray detector 1 includes a photoelectric conversion substrate 2. The photoelectric conversion substrate 2 is an active matrix photoelectric conversion substrate for converting visible light to electrical signals.

The photoelectric conversion substrate 2 includes a support substrate 3. The support substrate 3 is an insulating substrate formed from a translucent glass shaped like a rectangular plate. On the surface of the support substrate 3, a plurality of pixels 4 are arranged with spacing from each other in a two-dimensional matrix. Each pixel 4 includes a thin film transistor (TFT) 5 as a switching element, a charge storage capacitor 6, a pixel electrode 7, and a photoelectric conversion element 8 such as a photodiode.

As shown in FIG. 5, a plurality of control electrodes 11 are wired on the support substrate 3. The control electrode 11 is a control line along the row direction of the support substrate 3. The plurality of control electrodes 11 are each located between the pixels 4 on the support substrate 3 and spaced in the column direction of the support substrate 3. The gate electrodes 12 of the thin film transistors 5 are electrically connected to these control electrodes 11.

A plurality of read electrodes 13 along the column direction of the support substrate 3 are wired on the support substrate 3. The plurality of read electrodes 13 are each located between the pixels 4 on the support substrate 3 and spaced in the row direction of the support substrate 3. The source electrodes 14 of the thin film transistors 5 are electrically connected to these read electrodes 13. The drain electrode 15 of the thin film transistor 5 is electrically connected to each of the charge storage capacitor 6 and the pixel electrode 7.

As shown in FIG. 1, the gate electrode 12 of the thin film transistor 5 is formed like an island on the support substrate 3. An insulating film 21 is stacked on the support substrate 3 including the gate electrode 12. The insulating film 21 covers each gate electrode 12. A plurality of island-shaped semi-insulating films 22 are stacked on the insulating film 21. The semi-insulating film 22 is formed from semiconductor and functions as a channel region of the thin film transistors 5. The semi-insulating films 22 are opposed to the respective gate electrodes 12 and cover these gate electrodes 12. That is, the semi-insulating films 22 are provided on the respective gate electrodes 12 via the insulating film 21.

The source electrode 14 and the drain electrode 15 are each formed like an island on the insulating film 21 including the semi-insulating films 22. The source electrode 14 and the drain electrode 15 are insulated from and not electrically connected to each other. The source electrode 14 and the drain electrode 15 are provided on opposite sides on the gate electrode 12. One end part of the source electrode 14 and the drain electrode 15 is stacked on the semi-insulating film 22.

As shown in FIG. 5, the gate electrode 12 of each thin film transistor 5 is electrically connected to a common control electrode 11 together with the gate electrodes 12 of the other thin film transistors 5 located on the same row. Furthermore, the source electrode 14 of each thin film transistor 5 is electrically connected to a common read electrode 13 together with the source electrodes 14 of the other thin film transistors 5 located on the same column.

As shown in FIG. 1, the charge storage capacitor 6 includes an island-shaped lower electrode 23 formed on the support substrate 3. The insulating film 21 is stacked on the support substrate 3 including the lower electrode 23. The insulating film 21 extends from above the gate electrodes 12 of the thin film transistors 5 to above the lower electrodes 23. Furthermore, an island-shaped upper electrode 24 is stacked on the insulating film 21. The upper electrode 24 is opposed to the lower electrode 23 and covers the lower electrode 23. That is, the upper electrode 24 is provided on each lower electrode 23 via the insulating film 21. The drain electrode 15 is stacked on the insulating film 21 including the upper electrode 24. The other end part of the drain electrode 15 is stacked on the upper electrode 24 and electrically connected to the upper electrode 24.

An insulating layer 25 is stacked on the insulating film 21 including the semi-insulating films 22, the source electrodes 14, and the drain electrodes 15 of the thin film transistors 5 and the upper electrodes 24 of the charge storage capacitors 6. The insulating layer 25 is formed from e.g. silicon oxide (SiO2) around each pixel electrode 7.

A through hole 26 is opened in part of the insulating layer 25. The through hole 26 is a contact hole communicating with the drain electrode 15 of the thin film transistor 5. An island-shaped pixel electrode 7 is stacked on the insulating layer 25 including the through hole 26. The pixel electrode 7 is electrically connected to the drain electrode 15 of the thin film transistor 5 through the through hole 26.

A photoelectric conversion element 8 such as a photodiode for converting visible light to electrical signals is stacked on each pixel electrode 7.

A scintillator layer 31 is formed on the surface of the photoelectric conversion substrate 2 where the photoelectric conversion element 8 is formed. The scintillator layer 31 converts radiation such as X-rays to visible light. The scintillator layer 31 is formed by depositing a high-brightness fluorescent material in a columnar shape on the photoelectric conversion substrate 2 by vapor phase growth technique such as vacuum evaporation technique, sputtering technique, and CVD technique. The high-brightness fluorescent material is a phosphor such as a halide including cesium iodide (CsI) and an oxide-based compound including gadolinium oxysulfide (GOS). The scintillator layer 31 is formed to have a columnar crystal structure such that a plurality of strip-shaped columnar crystals 32 are formed in the in-plane direction of the photoelectric conversion substrate 2.

A reflective layer 41 is stacked on the scintillator layer 31. The reflective layer 41 enhances the utilization efficiency of visible light converted in the scintillator layer 31. A protective layer 42 is stacked on the reflective layer 41. The protective layer 42 protects the scintillator layer 31 from moisture in the atmosphere. An insulating layer 43 is stacked on the protective layer 42. An X-ray grid 44 is formed on the insulating layer 43. The X-ray grid 44 is shaped like a grid for shielding between the pixels 4.

In the X-ray detector 1 thus configured, radiation such as X-rays 51 is incident on the scintillator layer 31 and converted to visible light 52 in the columnar crystal 32 of the scintillator layer 31.

The visible light 52 travels through the columnar crystal to the photoelectric conversion element 8 of the photoelectric conversion substrate 2 and is converted to electrical signals. The electrical signal converted in the photoelectric conversion element 8 flows to the pixel electrode 7. The electrical signal is carried to the charge storage capacitor 6 connected to the pixel electrode 7. The electrical signal is held and stored in the charge storage capacitor 6 until the gate electrode 12 of the thin film transistor 5 connected to the pixel electrode 7 turns to the driving state.

At this time, when one of the control electrodes 11 is turned to the driving state, one row of thin film transistors 5 connected to this control electrode 11 turned to the driving state turn to the driving state.

The electrical signal stored in the charge storage capacitor 6 connected to each thin film transistor 5 turned to the driving state is outputted to the read electrode 13.

This results in outputting a signal corresponding to a particular row of pixels 4 of the X-ray image. Thus, the signal corresponding to all the pixels 4 of the X-ray image can be outputted by the driving control of the control electrodes 11. This output signal is converted to a digital image signal for output.

Figure 2:
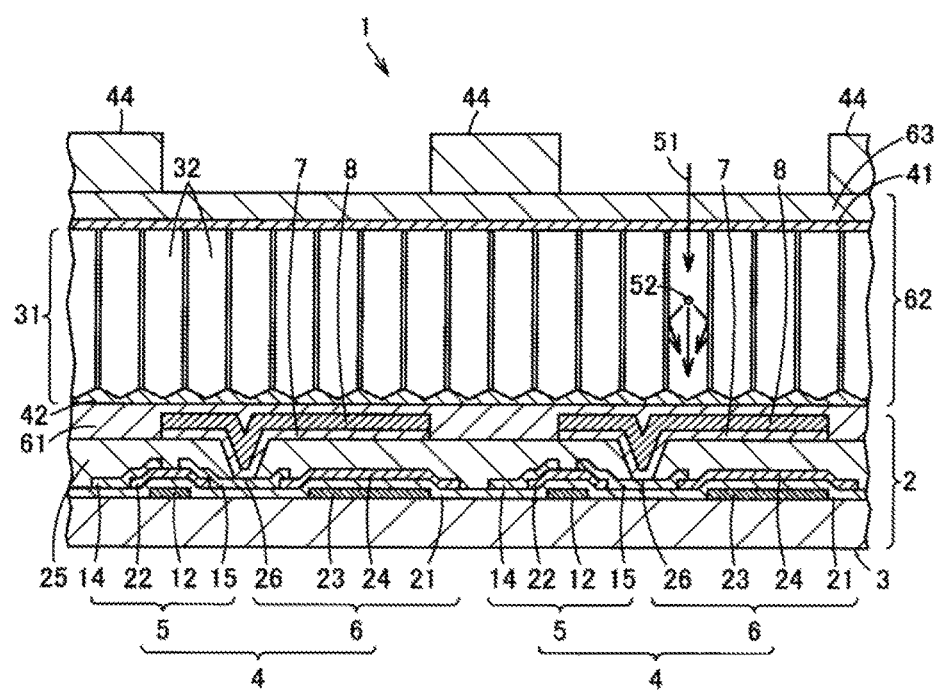
FIG. 2 is a sectional view of a second structure example of the above radiation detector.

Next, a second structure example of the X-ray detector 1 is described with reference to FIG. 2. The description uses the same reference numerals as in the first structure example of the X-ray detector 1, and omits the description of similar configurations and operations.

The photoelectric conversion substrate 2 has the same structure and operation as that of the first structure example.

A scintillator panel 62 is bonded onto the photoelectric conversion substrate 2 via a bonding layer 61. The scintillator panel 62 includes a support substrate 63 transmissive to X-rays 51. A reflective layer 41 reflective to light is formed on the support substrate 63. A scintillator layer 31 including a plurality of strip-shaped columnar crystals 32 is formed on the reflective layer 41. A protective layer 42 for sealing the scintillator layer 31 is stacked on the scintillator layer 31. Furthermore, an X-ray grid 44 shaped like a grid for shielding between the pixels 4 is formed on the support substrate 63.

In the X-ray detector 1 thus configured, X-rays 51 are incident on the scintillator layer 31 of the scintillator panel 62 and converted to visible light 52 in the columnar crystal 32 of the scintillator layer 31.

The visible light 52 travels through the columnar crystal to the photoelectric conversion element 8 of the photoelectric conversion substrate 2 and is converted to electrical signals. The electrical signal is converted to a digital image signal for output as described above.

Next, a third structure example of the X-ray detector 1 is described with reference to FIG. 3. The third structure example of the X-ray detector 1 is similar in configuration to the first structure example of the X-ray detector 1 shown in FIG. 1 except that the scintillator layer 31 does not include the columnar crystals 32.

Next, a fourth structure example of the X-ray detector 1 is described with reference to FIG. 4. The fourth structure example of the X-ray detector 1 is similar in configuration to the second structure example of the X-ray detector 1 shown in FIG. 2 except that the scintillator layer 31 does not include the columnar crystals 32.

In the X-ray detector 1 of the structures shown in FIG. 1 to FIG. 4, the scintillator layer 31 is made of a phosphor containing Tl as an activator in CsI, which is a halide. Furthermore, the scintillator layer 31 has the following features (1), (2), and (3).

(1) The concentration of the activator in the phosphor is 1.6 mass %±0.4 mass %. The concentration distribution of the activator in the in-plane direction and film thickness direction of the phosphor is within ±15%.

(2) In at least the region of a unit film thickness of 200 nm or less, the concentration distribution of the activator in the in-plane direction and film thickness direction of the phosphor is within ±15%. Thus, the uniformity is maintained.

(3) The scintillator layer 31 is formed by vacuum evaporation technique using two evaporation sources of CsI and TlI. Furthermore, preferably, the scintillator layer 31 has a structure of strip-shaped columnar crystals 32.

Figure 6:
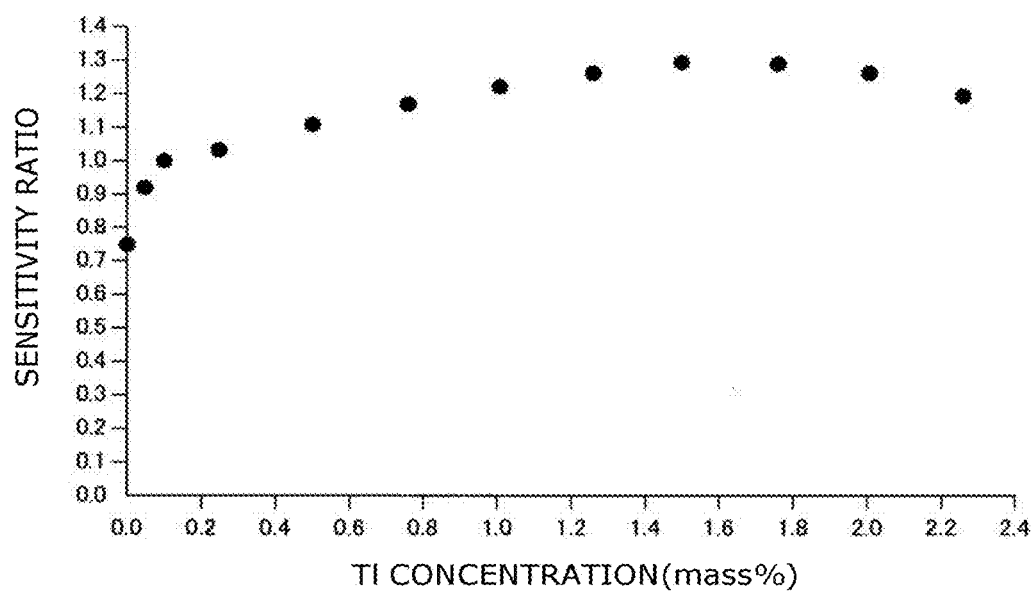
FIG. 6 is a graph showing the correlation between Tl concentration and sensitivity ratio of the scintillator layer of the above radiation detector.
Figure 7:
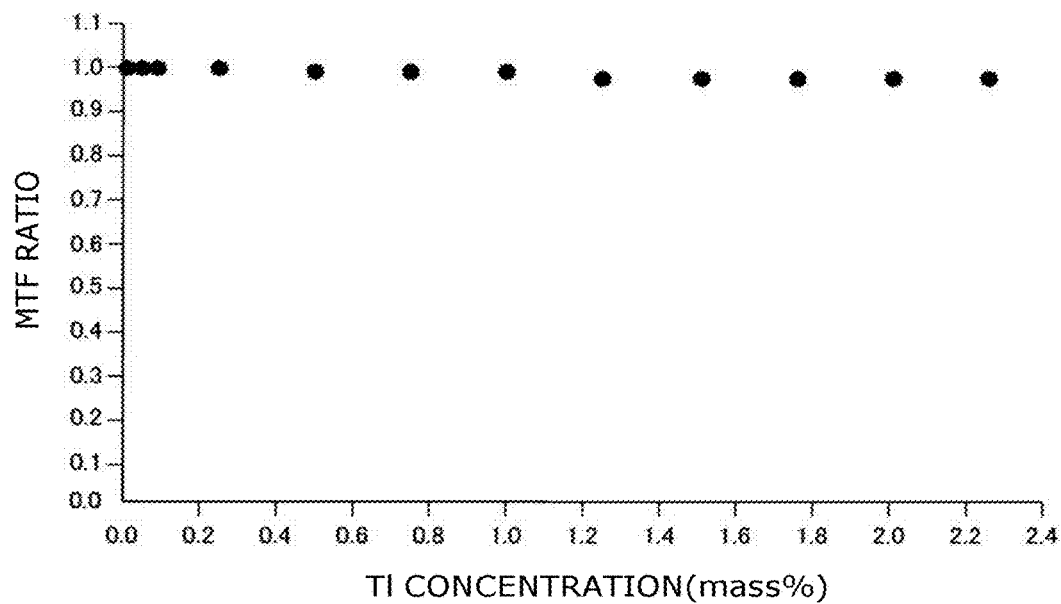
FIG. 7 is a graph showing the correlation between Tl concentration and MTF ratio of the above scintillator layer.
Figure 8:
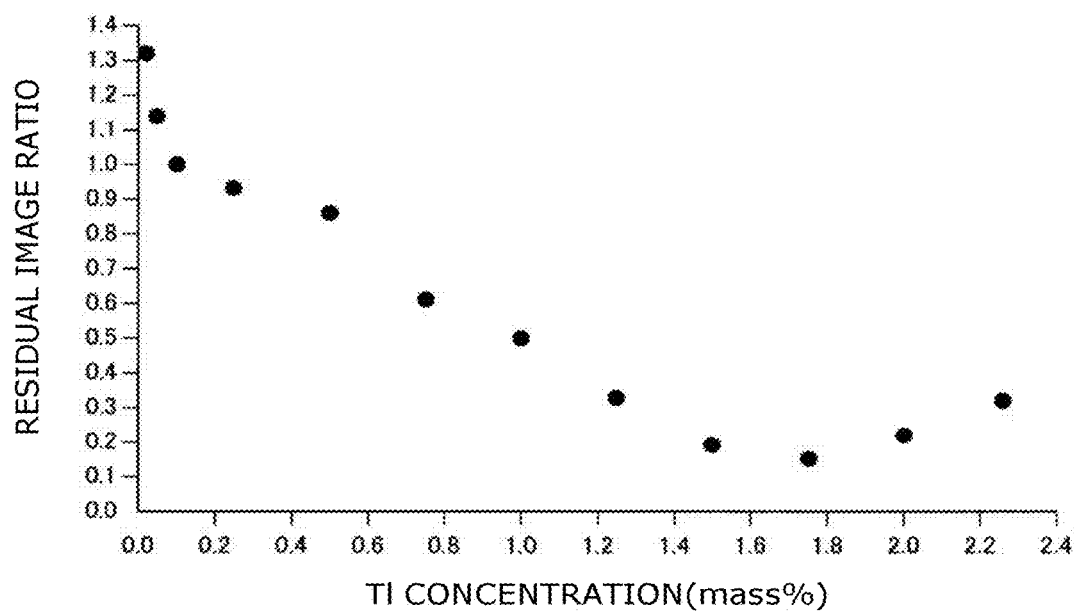
FIG. 8 is a graph showing the correlation between Tl concentration and residual image ratio of the above scintillator layer.
Figure 9:
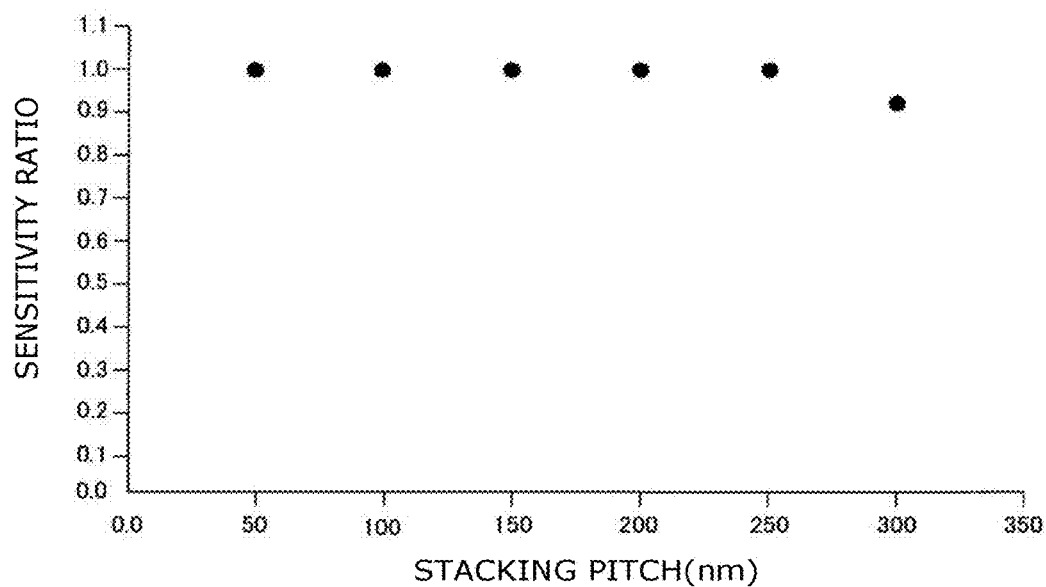
FIG. 9 is a graph showing the correlation between stacking pitch and sensitivity ratio of the above scintillator layer.
Figure 10:
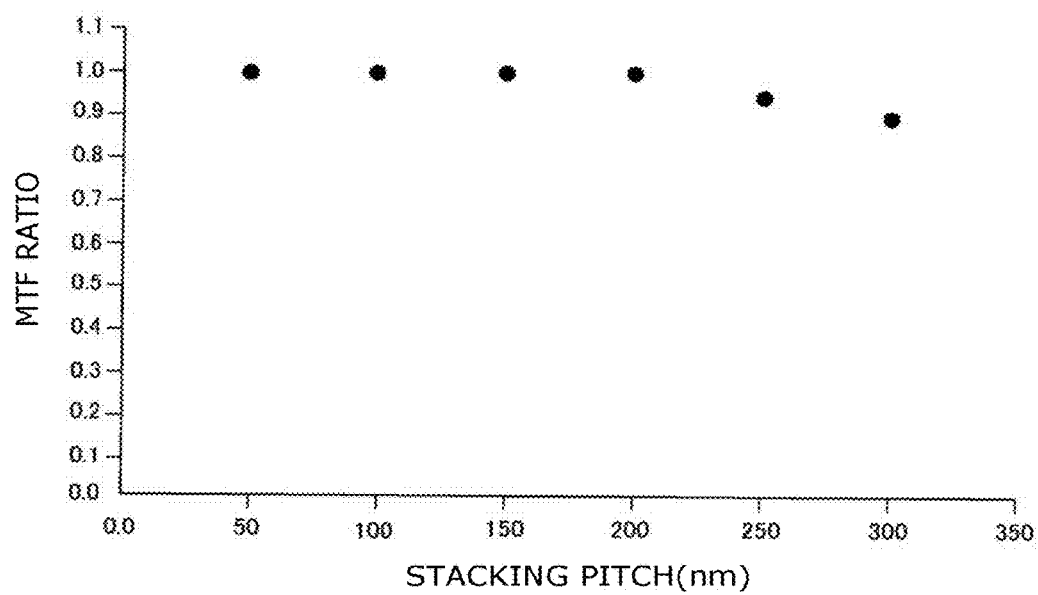
FIG. 10 is a graph showing the correlation between stacking pitch and MTF ratio of the above scintillator layer.
Figure 11:
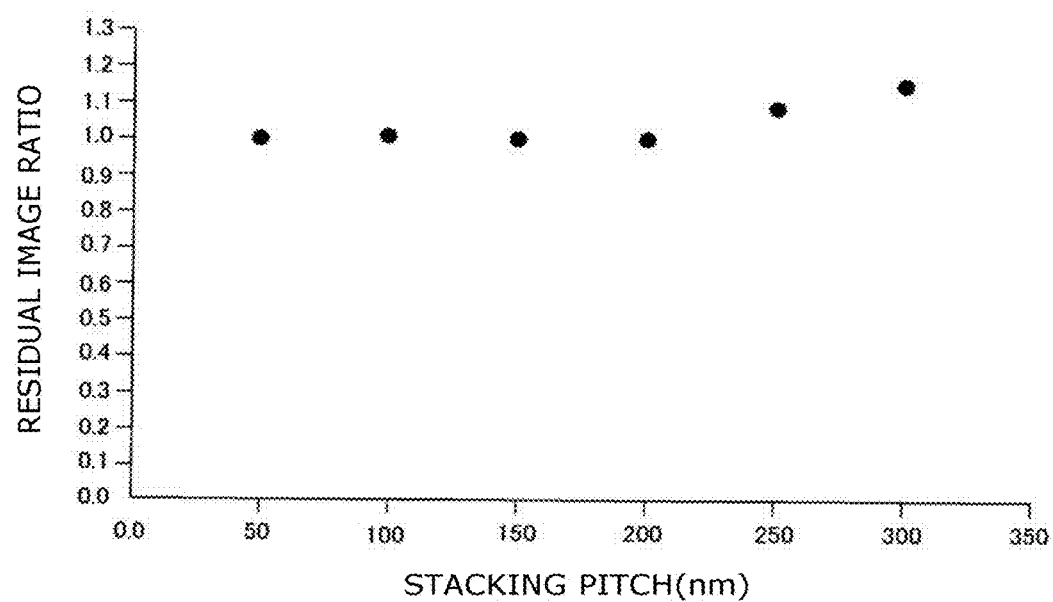
FIG. 11 is a graph showing the correlation between stacking pitch and residual image ratio of the above scintillator layer.

In the X-ray detector 1 of the first structure example shown in FIG. 1, the correlation of the Tl concentration in the scintillator layer 31 with various characteristics was tested. The result is shown in FIG. 6 to FIG. 8. In this test, the film thickness of the scintillator layer 31 is 600 μm, and the activator is Tl. Furthermore, the correlation of the stacking pitch (formation pitch of a unit film thickness (formation film thickness per rotation of the substrate)) of the scintillator layer 31 with various characteristics was tested. The result is shown in FIG. 9 to FIG. 11.

FIG. 6 shows the correlation of the Tl concentration in the scintillator layer 31 with sensitivity ratio. The test condition is such that X-rays are incident at 70 kV and 0.0087 mGy. The sensitivity ratio is the ratio with reference to the sensitivity in the case where the Tl concentration in the scintillator layer 31 is 0.1 mass %. The condition for forming the scintillator layer of each test sample is the same (except the Tl concentration in the scintillator layer 31). As shown in FIG. 6, the sensitivity was maximized for the Tl concentration in the scintillator layer 31 around 1.4 mass %-1.8 mass %.

FIG. 7 shows the correlation of the Tl concentration in the scintillator layer 31 with MTF ratio. The MTF ratio represents resolution. The test condition is such that X-rays are incident at 70 kV and 0.0087 mGy. The MTF ratio is the ratio with reference to MTF (at 2 Lp/mm) in the case where the Tl concentration in the scintillator layer 31 is 0.1 mass %. The condition for forming the scintillator layer of each test sample is the same (except the Tl concentration in the scintillator layer 31). As shown in FIG. 7, the result was generally constant up to the Tl concentration in the scintillator layer 31 around 2.0 mass %.

FIG. 8 shows the correlation of the Tl concentration in the scintillator layer 31 with residual image ratio. The test condition is as follows. The dose of incident X-rays in the (n−1)-th X-ray image is greater than that in the n-th X-ray image. In the (n−1)-th X-ray image, X-rays are incident at 70 kV and 0.87 mGy. The subject is a lead plate (plate thickness 3 mm). The X-ray image capture interval is 60 sec. In the n-th X-ray image, X-rays are incident at 70 kV and 0.0087 mGy. The subject is none. The X-ray image capture interval is 60 sec. Furthermore, the residual image ratio is the ratio with reference to the residual image in the case where the Tl concentration in the scintillator layer 31 is 0.1 mass %. The condition for forming the scintillator layer of each test sample is the same (except the Tl concentration in the scintillator layer 31). As shown in FIG. 8, the residual image was minimized for the Tl concentration in the scintillator layer 31 around 1.6 mass %. Furthermore, no residual image was observed in the region where the residual image ratio is 0.5 (preferably 0.4) or less and the Tl concentration in the scintillator layer 31 is 1.6 mass %±0.4 mass %.

FIG. 9 shows the correlation of the stacking pitch of the scintillator layer 31 with sensitivity ratio. The test condition is such that X-rays are incident at 70 kV and 0.0087 mGy. The Tl concentration in the scintillator layer 31 is 0.1 mass %. The sensitivity ratio is the ratio with reference to the sensitivity in the case where the stacking pitch of the scintillator layer 31 is 200 nm. The condition for forming the scintillator layer of each test sample is the same (except the Tl concentration in the scintillator layer 31).

FIG. 10 shows the correlation of the stacking pitch of the scintillator layer 31 with MTF ratio. The test condition is such that X-rays are incident at 70 kV and 0.0087 mGy. The Tl concentration in the scintillator layer 31 is 0.1 mass %. The MTF ratio is the ratio with reference to MTF (at 2 Lp/mm) in the case where the stacking pitch of the scintillator layer 31 is 200 nm. The condition for forming the scintillator layer of each test sample is the same (except the Tl concentration in the scintillator layer 31).

FIG. 11 shows the correlation of the stacking pitch of the scintillator layer 31 with residual image ratio. The test condition is such that the dose of incident X-rays in the (n−1)-th X-ray image is greater than that in the n-th X-ray image. In the (n−1)-th X-ray image, X-rays are incident at 70 kV and 0.87 mGy. The subject is a lead plate (plate thickness 3 mm). The X-ray image capture interval is 60 sec. In the n-th X-ray image, X-rays are incident at 70 kV and 0.0087 mGy. The subject is none. The X-ray image capture interval is 60 sec. Furthermore, the Tl concentration in the scintillator layer 31 is 0.1 mass %. The residual image ratio is the ratio with reference to the residual image in the case where the stacking pitch of the scintillator layer 31 is 200 nm. The condition for forming the scintillator layer of each test sample is the same (except the Tl concentration in the scintillator layer 31).

As shown in FIG. 9 to FIG. 11, the characteristics tend to be degraded in the region where the stacking pitch of the scintillator layer 31 is 200 nm or more.

The light emission wavelength of the scintillator layer 31 has a peak wavelength around 550 nm. The scintillator layer 31 is made primarily of CsI, which has a refractive index of 1.8. The peak wavelength of light emission propagating in the scintillator layer 31 is denoted by $\lambda 1$. Then, it can be regarded that $\lambda 1 = 550$ nm$/1.8 = 306$ nm from the relationship between refractive index and wavelength. Thus, in the case where the stacking pitch of the scintillator layer 31 is larger than $\lambda 1$, the result of FIG. 9 to FIG. 11 is attributable to the increased possibility of the influence of the degradation of optical characteristics (such as scattering and attenuation) associated with e.g. variation of the crystallinity of the scintillator layer 31 and variation of the Tl concentration in the scintillator layer 31.

As shown in FIG. 8, the residual image was minimized when the concentration of the activator in the phosphor constituting the scintillator layer 31 is around 1.6 mass %. No residual image was observed in the region of 1.6 mass %±0.4 mass % where the residual image ratio is 0.5 (preferably 0.4) or less. Furthermore, as shown in FIG. 6 and FIG. 7, the characteristics of sensitivity and MTF are also favorable in the region of 1.6 mass %±0.4 mass %. Thus, the concentration of the activator is preferably in the region of 1.6 mass %±0.4 mass %.

As shown in FIG. 6 to FIG. 8, the characteristics are nearly stable in the region where the Tl concentration in the scintillator layer 31 is 1.6 mass %±0.4 mass %. Thus, the variation of the characteristics is small even if the Tl concentration in the scintillator layer 31 is varied (approximately ±15%).

Even if the concentration of the activator in the phosphor is in the region of 1.6 mass %±0.4 mass %, the characteristics are likely to vary significantly if the concentration distribution of the activator is significantly biased in the in-plane direction and film thickness direction of the phosphor. Thus, the concentration distribution of the activator in the in-plane direction and film thickness direction of the phosphor is preferably within ±15%. The variation of characteristics is small and has little influence if the concentration distribution of the activator is in the variation range of approximately ±15%.

Thus, as described above in feature (1), preferably, the concentration of the activator in the phosphor is 1.6 mass %±0.4 mass %, and the concentration distribution of the activator in the in-plane direction and film thickness direction of the phosphor is within ±15%.

In at least the region of the phosphor where the unit film thickness is 200 nm or less, the characteristics are likely to vary significantly if the concentration distribution of the activator is significantly biased in the in-plane direction and film thickness direction of the phosphor. Thus, as described above in feature (2), preferably, also in the region of a unit film thickness of 200 nm or less, the concentration distribution of the activator in the in-plane direction and film thickness direction of the phosphor is within ±15%.

Figure 12:
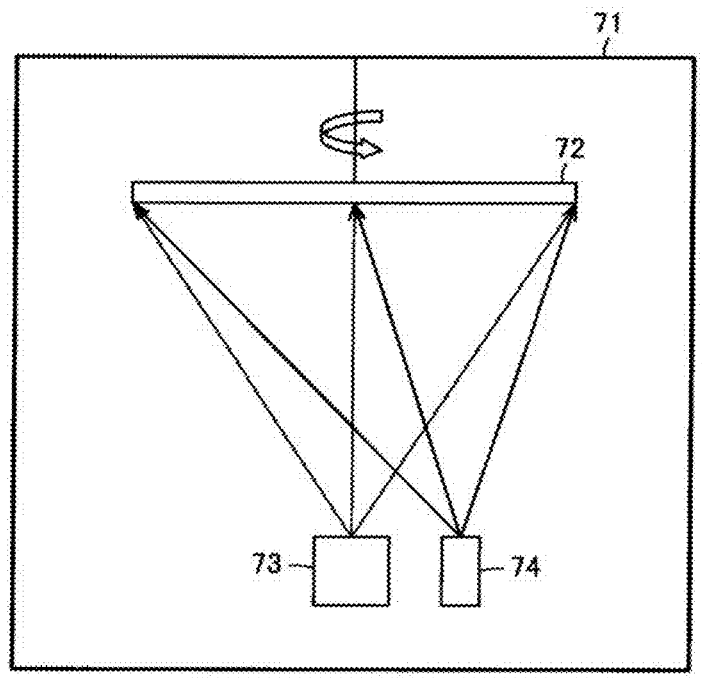
FIG. 12 is a schematic view showing a method for forming the above scintillator layer.

FIG. 12 is a schematic view of a method for forming the scintillator layer 31. A substrate 72 (corresponding to the photoelectric conversion substrate 2 or the support substrate 63) is placed in the vacuum chamber 71. The film of the scintillator layer 31 is stacked by vacuum evaporation technique. In the vacuum evaporation technique, evaporation particles from the evaporation source 73 of CsI and evaporation particles from the evaporation source 74 of TlI placed in the vacuum chamber 71 are evaporated on the stacking surface of the substrate 72 while rotating the substrate 72.

At this time, the Tl concentration distribution in the in-plane direction and film thickness direction per stacking cycle of the scintillator layer 31 can be arbitrarily controlled by controlling the rotation cycle of the substrate 72 and the evaporation of CsI and TlI. Thus, the uniformity of the Tl concentration distribution in the in-plane direction and film thickness direction of the overall scintillator layer 31 is ensured by ensuring the uniformity of the Tl concentration distribution in the in-plane direction and film thickness direction per stacking cycle of the scintillator layer 31 when the scintillator layer 31 is formed.

Accordingly, the characteristics, in particular the residual image characteristic, of the scintillator layer 31 can be improved by providing the above features (1)-(3) to the scintillator layer 31 made of a phosphor containing Tl as an activator in CsI, which is a halide.

A practical example of the X-ray detector 1 of the first structure example shown in FIG. 1 is now described. In this practical example, the film thickness of the scintillator layer 31 is 600 μm. The stacking pitch of the scintillator layer 31 is 150 nm. The concentration distribution of the activator in the in-plane direction and film thickness direction of the scintillator layer 31 is ±15%. The activator is Tl. Five samples are produced with the concentration of the activator in the scintillator layer 31 being 0.1 mass %, 1.0 mass %, 1.2 mass %, 1.6 mass %, and 2.0 mass %.

For these five samples, the subject is radiographed under a particular radiography condition. The radiographed image is processed in a prescribed image processing condition. FIGS. 13A, 13B, 13C, 13D, and 13E show (n-th) X-ray images in this case. The table of FIG. 14 shows the result of the characteristics. In FIG. 14, the sensitivity ratio, the MTF ratio, and the residual image ratio are the values with reference to the case where the Tl concentration in the scintillator layer 31 is 0.1 mass %.

The radiography condition is as follows. The dose of incident X-rays in the (n−1)-th X-ray image is greater than that in the n-th X-ray image. In the (n−1)-th X-ray image, X-rays are incident at 70 kV and 0.87 mGy. The subject is a lead plate (plate thickness 3 mm). The X-ray image capture interval is 60 sec. In the n-th X-ray image, X-rays are incident at 70 kV and 0.0087 mGy. The subject is none. The X-ray image capture interval is 60 sec.

With regard to the image processing condition, the flat field correction is applied. The window processing is applied (the histogram average of the image ±10%).

Figure 13A:
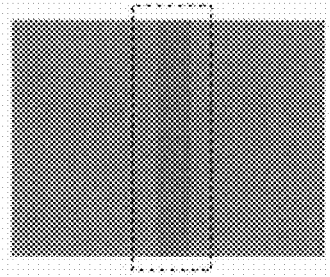
FIGS. 13A to 13E are X-ray images radiographed under particular radiography conditions by the above radiation detector.
Figure 13B:
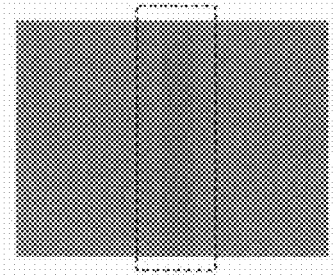
Figure 13C:
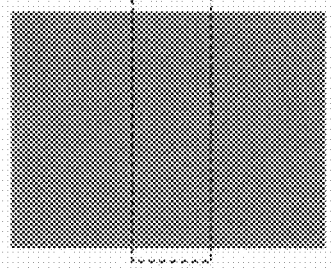
Figure 13D:
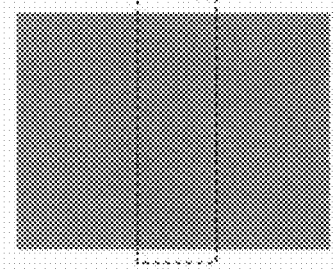
Figure 13E:
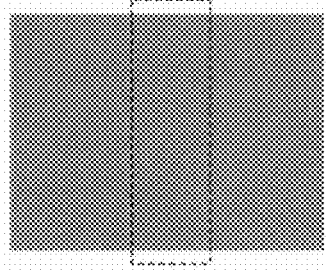

As shown in FIGS. 13A and 13B, when the concentration of the activator is 0.1 mass % and 1.0 mass %, a residual image is observed in the range enclosed with the dashed line in the figure. As shown in FIGS. 13C, 13D, and 13E, when the concentration of the activator is 1.2 mass %, 1.6 mass %, and 2.0 mass %, no residual image is observed in the range enclosed with the dashed line in the figure.

Thus, if the above features (1)-(3) defined in this embodiment are provided to the scintillator layer 31, the residual image characteristic can be improved with the sensitivity and MTF being also favorable. This can improve the performance and reliability of the X-ray detector 1.

Next, an embodiment in which the scintillator layer according to the invention is used in a scintillator panel is described.

In FIG. 15 to FIG. 19, the basic configuration of the scintillator panel 90 is described with reference to first to fourth structure examples.

Figure 15:
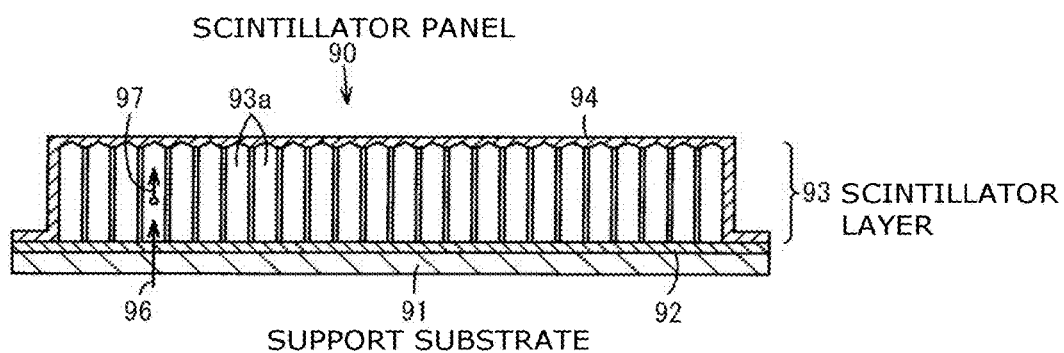
FIG. 15 is a sectional view of a first structure example of a scintillator panel showing an embodiment.

First, a first structure example of the scintillator panel 90 is described with reference to FIG. 15. The scintillator panel 90 includes a support substrate 91 transmissive to radiation such as X-rays. A reflective layer 92 reflective to light is formed on the support substrate 91. A scintillator layer 93 for converting radiation to visible light is formed on the reflective layer 92. A protective layer 94 for sealing the scintillator layer 93 is stacked on the scintillator layer 93.

The support substrate 91 is formed from a material composed primarily of light elements rather than transition metal elements and having good X-ray transmittance.

The reflective layer 92 is made of a metal material having high reflectance such as Al, Ni, Cu, Pd, and Ag. The reflective layer 92 reflects light generated in the scintillator layer 93 to the direction opposite to the support substrate 91. Thus, the reflective layer 92 enhances the light utilization efficiency.

The scintillator layer 93 is formed by depositing a high-brightness fluorescent material in a columnar shape on the support substrate 91 by vapor phase growth technique such as vacuum evaporation technique, sputtering technique, and CVD technique. The high-brightness fluorescent material is a phosphor such as a halide including cesium iodide (CsI) and an oxide-based compound including gadolinium oxy-sulfide (GOS). The scintillator layer 93 is formed in a columnar crystal structure such that a plurality of strip-shaped columnar crystals 93a are formed in the in-plane direction of the support substrate 91.

In the scintillator panel 90 thus configured, radiation such as X-rays 96 is incident on the scintillator layer 93 from the support substrate 91 side and converted to visible light 97 in the columnar crystal 93a of the scintillator layer 93. The visible light 97 is emitted from the surface of the scintillator layer 93 (the surface of the protective layer 94) on the opposite side from the support substrate 91.

Figure 16:
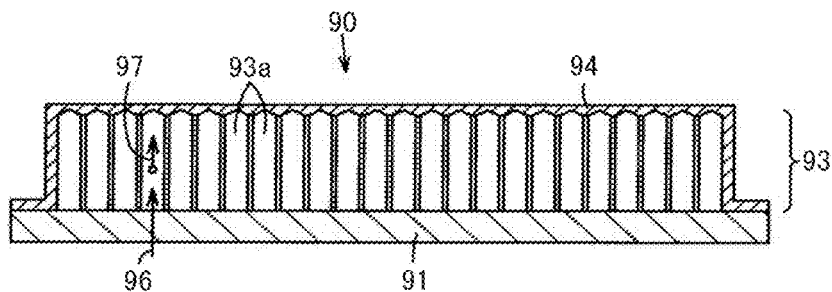
FIG. 16 is a sectional view of a second structure example of the above scintillator panel.

FIG. 16 shows a second structure example of the scintillator panel 90. The second structure example of the scintillator panel 90 is similar in configuration to the first structure example of the scintillator panel 90 shown in FIG. 15 except for not including the reflective layer 92.

Figure 17:
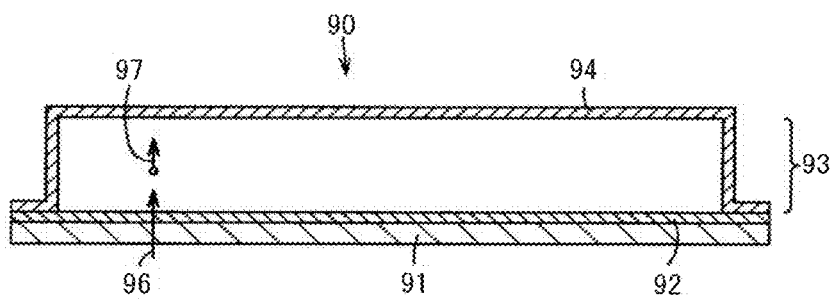
FIG. 17 is a sectional view of a third structure example of the above scintillator panel.

FIG. 17 shows a third structure example of the scintillator panel 90. The third structure example of the scintillator panel 90 is similar in configuration to the first structure example of the scintillator panel 90 shown in FIG. 15 except that the scintillator layer 93 does not include the columnar crystals 93a.

Figure 18:
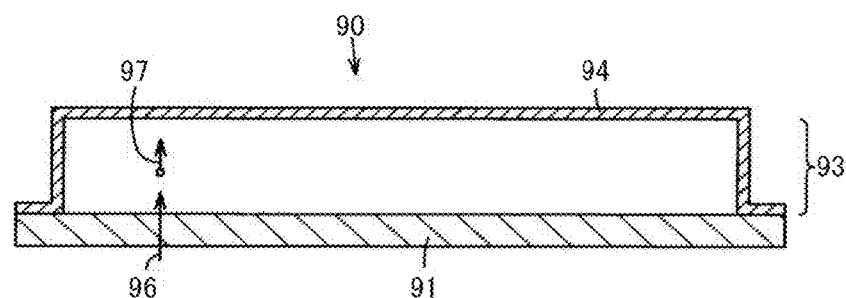
FIG. 18 is a sectional view of a fourth structure example of the above scintillator panel.

FIG. 18 shows a fourth structure example of the scintillator panel 90. The fourth structure example of the scintillator panel 90 is similar in configuration to the second structure example of the scintillator panel 90 shown in FIG. 16 except that the scintillator layer 93 does not include the columnar crystals 93a.

Figure 19:
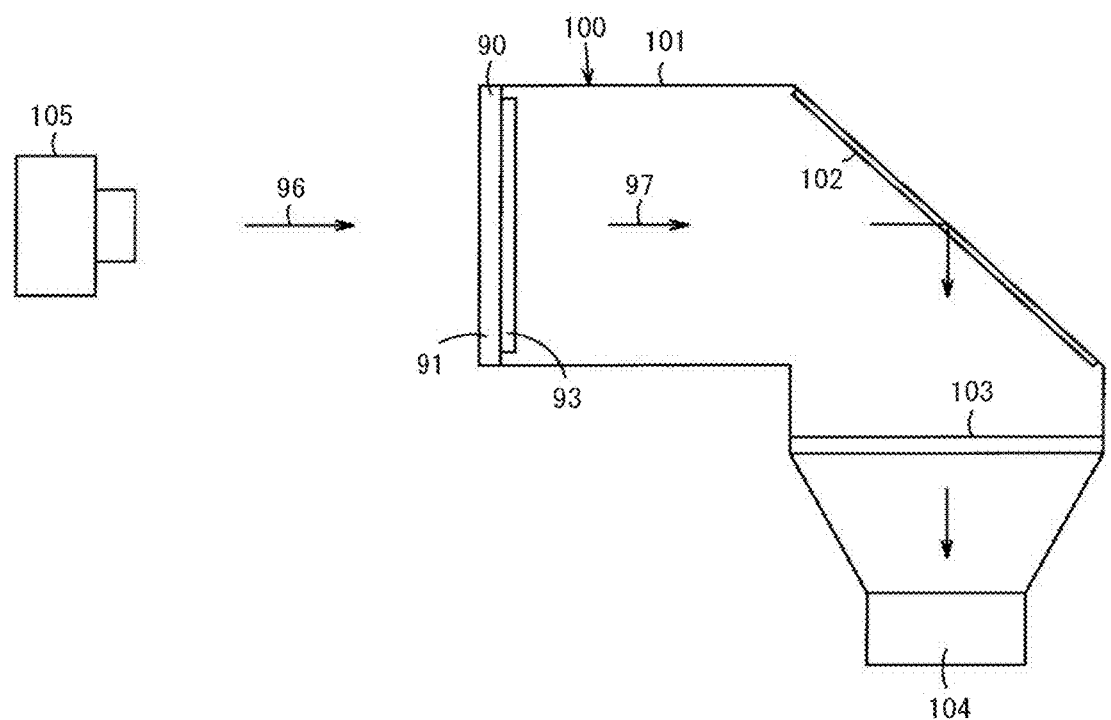
FIG. 19 is a sectional view of a radiography device based on the above scintillator panel.

FIG. 19 shows a radiography device 100 of e.g. the CCD-DR type based on the scintillator panel 90. The radiography device 100 includes a housing 101. The scintillator panel 90 is placed at one end of the housing 101. A specular reflective plate 102 and an optical lens 103 are placed inside the housing 101. A light receiving element 104 such as CCD is placed at the other end of the housing 101. X-rays 96 are radiated from the X-ray source (X-ray tube) 105 and incident on the scintillator panel 90. The visible light 97 converted in the scintillator layer 93 is emitted from the surface of the scintillator layer 93. The X-ray image is projected on the surface of the scintillator layer 93. This X-ray image is reflected by the reflective plate 102. On the other hand, the X-ray image is collected by the optical lens 103 and applied to the light receiving element 104. The X-ray image is converted to electrical signals in the light receiving element 104 for output.

In the scintillator panel 90 of the structures shown in FIG. 15 to FIG. 19, the scintillator layer 93 is made of a phosphor containing Tl as an activator in CsI, which is a halide. Furthermore, the scintillator layer 93 has the following features (1), (2), and (3).

(1) The concentration of the activator in the phosphor is 1.6 mass %±0.4 mass %. The concentration distribution of the activator in the in-plane direction and film thickness direction of the phosphor is within ±15%.

(2) In at least the region of a unit film thickness of 200 nm or less, the concentration distribution of the activator in the in-plane direction and film thickness direction of the phosphor is within ±15%. Thus, the uniformity is maintained.

(3) The scintillator layer 93 is formed by vacuum evaporation technique using two evaporation sources of CsI and TlI. Furthermore, preferably, the scintillator layer 93 has a structure of strip-shaped columnar crystals 93a.

As described with reference to FIG. 6 to FIG. 11, the scintillator layer 93 having the above features (1)-(3) defined in this embodiment is used in the scintillator panel 90. Thus, the residual image characteristic can be improved with favorable sensitivity and MTF provided to the scintillator panel 90. This can improve the performance and reliability of the scintillator panel 90.

The method for forming the scintillator layer 93 can be made similar to the method for forming the scintillator layer 31 described with reference to FIG. 12.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A radiation detector comprising:
a photoelectric conversion substrate converting light to an electrical signal; and
a scintillator layer being in contact with the photoelectric conversion substrate and converting externally incident radiation to light,
the scintillator layer being made of a phosphor containing Tl as an activator in CsI, which is a halide, a concentration of the activator in the phosphor being 1.6 mass %±0.4 mass %, a concentration distribution of the activator in an in-plane direction being within ±15%, and a concentration distribution of the activator in a film thickness direction being within ±15%.

2. The radiation detector according to claim 1, wherein in the scintillator layer, the concentration distribution of the activator in the in-plane direction is ±15% or less in a region of a unit film thickness of 200 nm or less and the concentration distribution of the activator in the film thickness direction is ±15% or less in the region of the unit film thickness of 200 nm or less.

3. The radiation detector according to claim 1, wherein the scintillator layer has a columnar crystal structure.

4. A method for manufacturing a radiation detector including a photoelectric conversion substrate converting light to an electrical signal and a scintillator layer being in contact with the photoelectric conversion substrate and converting externally incident radiation to light,
the scintillator layer being made of a phosphor containing Tl as an activator in CsI, which is a halide,
the method comprising:
forming the scintillator layer by a vapor phase growth technique using a material source of CsI and Tl, a concentration of the activator in the phosphor being 1.6 mass %±0.4 mass %, a concentration distribution of the activator in an in-plane direction being within ±15, and a concentration distribution of the activator in a film thickness direction being within ±15%.

5. A scintillator panel comprising:
a support substrate transmissive to radiation; and
a scintillator layer being in contact with the support substrate and converting externally incident radiation to light,
the scintillator layer being made of a phosphor containing Tl as an activator in CsI, which is a halide, a concentration of the activator in the phosphor being 1.6 mass %±0.4 mass %, a concentration distribution of the activator in an in-plane direction being within ±15%, and a concentration distribution of the activator in a film thickness direction being within ±15%.

6. The scintillator panel according to claim 5, wherein in the scintillator layer, the concentration distribution of the activator in the in-plane direction is ±15% or less in a region of a unit film thickness of 200 nm or less and the concentration distribution of the activator in the film thickness direction is ±15% or less in the region of the unit film thickness of 200 nm or less.

7. The scintillator panel according to claim 5, wherein the scintillator layer has a columnar crystal structure.

8. The scintillator panel according to claim 5, wherein the support substrate is formed from a material composed primarily of a light element rather than a transition metal element.

9. A method for manufacturing a scintillator panel including a support substrate transmissive to radiation and a scintillator layer being in contact with the support substrate and converting externally incident radiation to light,
the scintillator layer being made of a phosphor containing Tl as an activator in CsI, which is a halide,
the method comprising:
forming the scintillator layer by a vapor phase growth technique using a material source of CsI and Tl, a concentration of the activator in the phosphor is 1.6 mass %±0.4 mass %, a concentration distribution of the activator in an in-plane direction and a film thickness direction being within ±15%, and a concentration distribution of the activator in a film thickness direction being within ±15%.

* * * * *